(12) United States Patent
Tu et al.

(10) Patent No.: US 12,165,966 B2
(45) Date of Patent: Dec. 10, 2024

(54) PACKAGE AND METHOD OF MANUFACTURING THE SAME

(71) Applicant: Taiwan Semiconductor Manufacturing Company, Ltd., Hsinchu (TW)

(72) Inventors: Meng-Che Tu, Hsinchu (TW); Sih-Hao Liao, New Taipei (TW); Yu-Hsiang Hu, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 211 days.

(21) Appl. No.: 17/377,419

(22) Filed: Jul. 16, 2021

(65) Prior Publication Data
US 2023/0013491 A1 Jan. 19, 2023

(51) Int. Cl.
| | | |
|---|---|---|
| *H01L 23/522* | (2006.01) | |
| *H01L 21/56* | (2006.01) | |
| *H01L 21/768* | (2006.01) | |
| *H01L 21/78* | (2006.01) | |
| *H01L 23/31* | (2006.01) | |
| *H01L 23/528* | (2006.01) | |

(52) U.S. Cl.
CPC ......... *H01L 23/5226* (2013.01); *H01L 21/56* (2013.01); *H01L 21/76802* (2013.01); *H01L 21/78* (2013.01); *H01L 23/31* (2013.01); *H01L 23/528* (2013.01)

(58) Field of Classification Search
CPC ................. H01L 23/5226; H01L 21/56; H01L 21/76802; H01L 21/78; H01L 23/31; H01L 23/528; H01L 21/561; H01L 23/3114; H01L 24/18
See application file for complete search history.

(56) References Cited

U.S. PATENT DOCUMENTS

| | | | | |
|---|---|---|---|---|
| 9,478,576 | B1* | 10/2016 | Yin | ................... H01L 27/14687 |
| 2017/0323840 | A1* | 11/2017 | Chiu | ..................... H01L 21/568 |
| 2020/0135708 | A1* | 4/2020 | Chen | .................. H01L 23/5389 |
| 2021/0193542 | A1* | 6/2021 | Chang | ............... H01L 23/49822 |

* cited by examiner

*Primary Examiner* — Thanh T Nguyen
(74) *Attorney, Agent, or Firm* — JCIPRNET

(57) ABSTRACT

A package including a device die and an encapsulant is provided. The device die includes a semiconductor substrate, an interconnect structure, a conductive via, and a dielectric layer. The interconnect structure is disposed over the semiconductor substrate. The conductive via is disposed over and electrically coupled to the interconnect structure. The dielectric layer is disposed over the interconnect structure and laterally encapsulating the conductive via, wherein the dielectric layer includes a sidewall and a bottom surface facing the interconnect structure, and the sidewall of the dielectric layer is tilted with respect to the bottom surface of the dielectric layer. The encapsulant laterally encapsulates the device die.

20 Claims, 20 Drawing Sheets

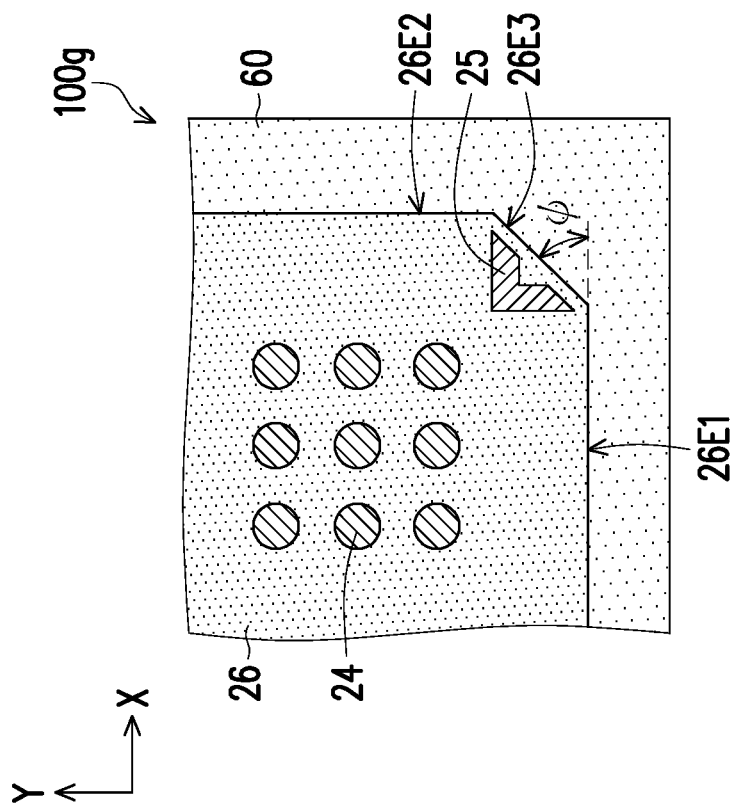
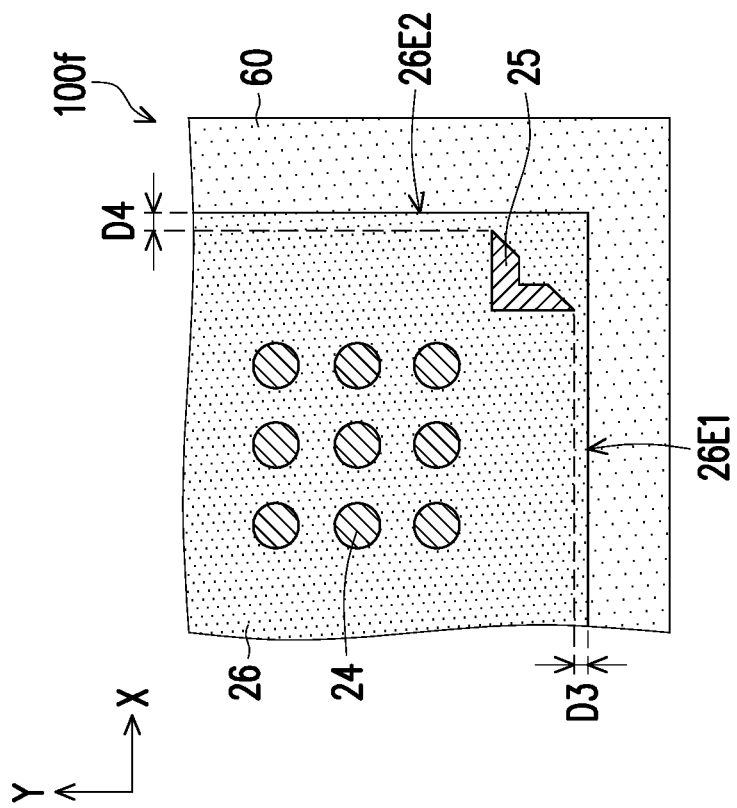
FIG. 11A
FIG. 11B

PACKAGE AND METHOD OF MANUFACTURING THE SAME

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises over time. As a result, the packaging of the semiconductor dies becomes more difficult, which adversely affects the yield of the packaging.

In one packaging technology, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11A is a top view of a portion of a package in accordance with some embodiments.

FIG. 11B is a top view of a portion of another package in accordance with some embodiments.

DETAILED DESCRIPTION

Figure 1:
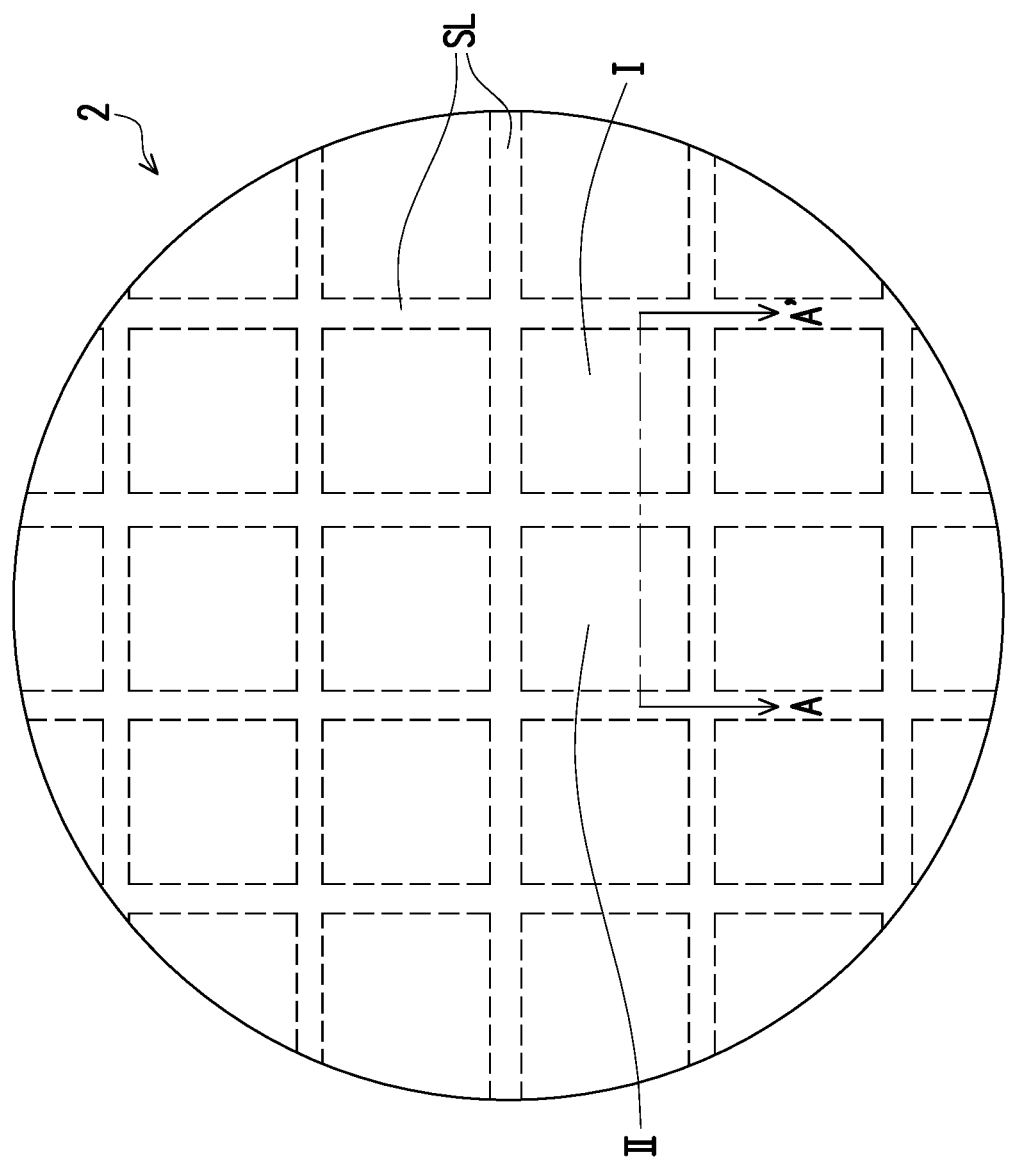
FIG. 1 is a top view of a wafer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view of a wafer in accordance with some embodiments. FIGS. 2A through 2J are cross-sectional views taken along the line A-A shown in FIG. 1 to illustrate a method of manufacturing a package at various stages in accordance with some embodiments.

Figure 2A:
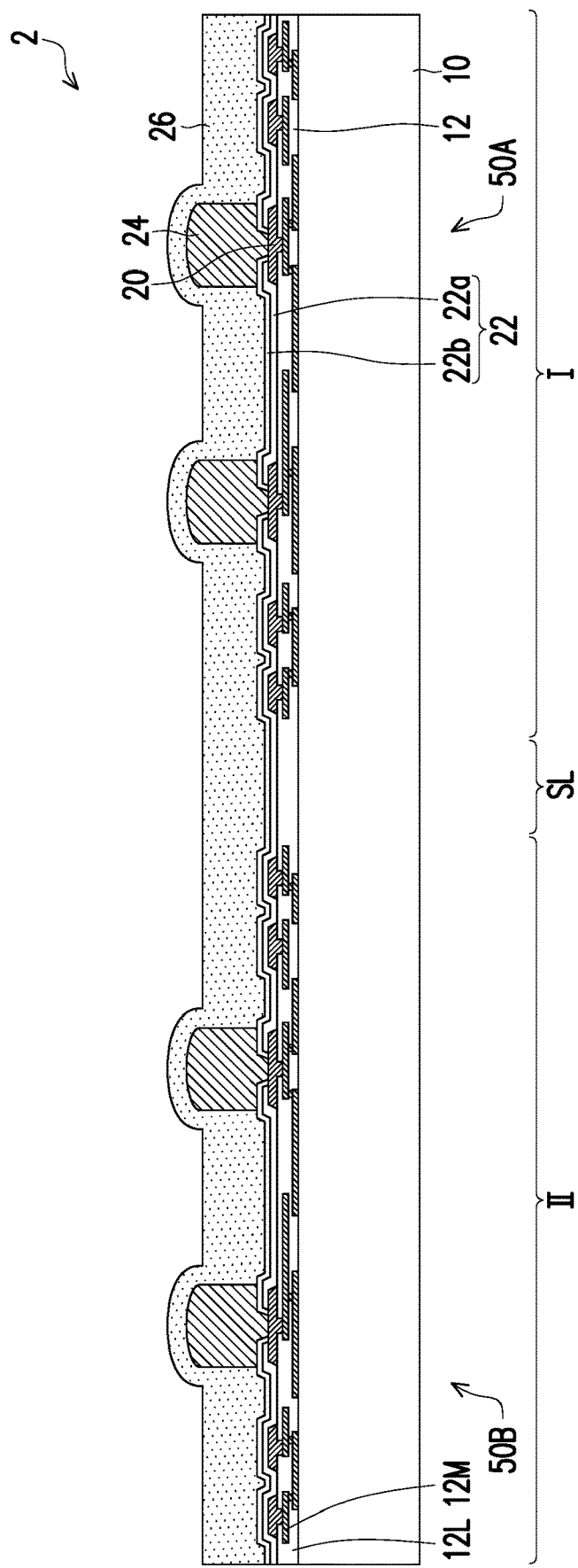
FIGS. 2A through 2J are cross-sectional views taken along the line A-A shown in FIG. 1 to illustrate a method of manufacturing a package at various stages in accordance with some embodiments of the present disclosure.

Referring first to FIG. 1 and FIG. 2A, a wafer 2 includes a plurality of die regions including a first die region I and a second die region II thereon. In some embodiments, the wafer 2 is a semiconductor wafer. On the wafer 2, an array of the die regions I and II are separated from each other by two sets of intersecting scribe line regions (scribe lines SL). One set of scribe lines SL extend along a first direction and another set of scribe lines SL extend along a second direction perpendicular to the first direction.

Referring to FIG. 2A, the cross-section view illustrates a first device die 50A formed in the first die region I and a second device die 50B formed in the second die region II, and the die regions I and II are separated by the scribe lines SL. In accordance with some embodiments, the device dies 50A and 50B have substantially identical structures. The Wafer 2 includes a semiconductor substrate 10, which may be a silicon substrate or a substrate formed of other semiconductor materials such as silicon germanium, silicon carbon, III-V compound semiconductor materials, or the like. Semiconductor devices, which may be transistors, capacitors, resistors, diodes, or the like, may be formed at a surface of the semiconductor substrate 10.

An interconnect structure 12 may be formed over the semiconductor substrate 10. The interconnect structure 12 may include a plurality of dielectric layers 12L and metal lines and/or metal vias 12M formed inside the dielectric layers 12L. The dielectric layer 12L may be formed, for example, of a low dielectric constant (low-K) dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the uppermost dielectric layer 12L is formed of a dielectric material, such as silicon nitride, silicon oxide, undoped silicon glass, and the like. In some embodiments, the metal lines and/or vias 12M may be formed to provide an electrical connection to the semiconductor devices formed in the semiconductor substrate 10.

Conductive pads 20 may be formed over the interconnect structure 12. The conductive pads 20 may include aluminum (Al), copper (Cu), silver (Ag), gold (Au), nickel (Ni), tungsten (W), alloys thereof, and/or multi-layers thereof. The conductive pads 20 may be electrically coupled to semiconductor devices, for example, through the contact plugs and the metal lines and/or vias 12M in the underlying interconnect structure 12.

A passivation layer 22 may be formed over the conductive pads 20. In some embodiments, the passivation layer 22 includes an inorganic layer 22a and an organic layer 22b over the inorganic layer 22a. The inorganic layer 22a may be formed to cover edge portions of the conductive pads 20. In some embodiments, the inorganic layer 22a includes a silicon oxide layer and a silicon nitride layer over the silicon oxide layer, although other dielectric materials may be used. The organic layer 22b may be formed over inorganic layer 22a and extends into the openings in the inorganic layer 22a. The organic layer 22b may be formed of polybenzoxazole (PBO), benzocyclobutene (BCB), polyimide, or the like. The organic layer 22b may then be patterned to form openings through which the conductive pads 20 are exposed. However, some of the conductive pads 20 may not be exposed by the openings formed in the inorganic layer 22a and the organic layer 22b.

Conductive vias 24 are formed to extend into the organic layer 22b, and are in contact with conductive pads 20. The conductive vias 24 may be formed of copper, aluminum, nickel, alloys thereof, and/or multi-layers thereof. In some embodiments, a seed layer (not shown) is formed over, and extending into the openings of, the organic layer 22b. The seed layer may be formed of a barrier/adhesion layer comprising titanium, titanium nitride, tantalum, tantalum nitride, or the like, and a copper or copper alloy layer over the barrier/adhesion layer. A photo resist (not shown) may then be formed over the seed layer and then patterned, followed by a plating process to form the conductive vias 24. The photo resist is then removed. The portions of the seed layer previously covered by the photo resist are then etched, leaving the conductive vias 24. The conductive vias 24 are electrically coupled to semiconductor devices through conductive pads 20 and the metal lines and/or metal vias 12M in interconnect structure 12.

A dielectric layer 26 may then be disposed to cover and protect the conductive vias 24. For example, the material of the dielectric layer 26 may be coated on the wafer 2 and cover the conductive vias 24. In accordance with some embodiments of the present disclosure, the dielectric layer 26 is formed of PBO, polyimide, BCB, or the like. The dielectric layer 26 may be formed of a material the same as, or different from, the material of the organic layer 22b. In some embodiments, the interconnect structure 12, the passivation layer 22, and the dielectric layer 26 are formed to extend into the scribe lines SL.

Figure 2B:
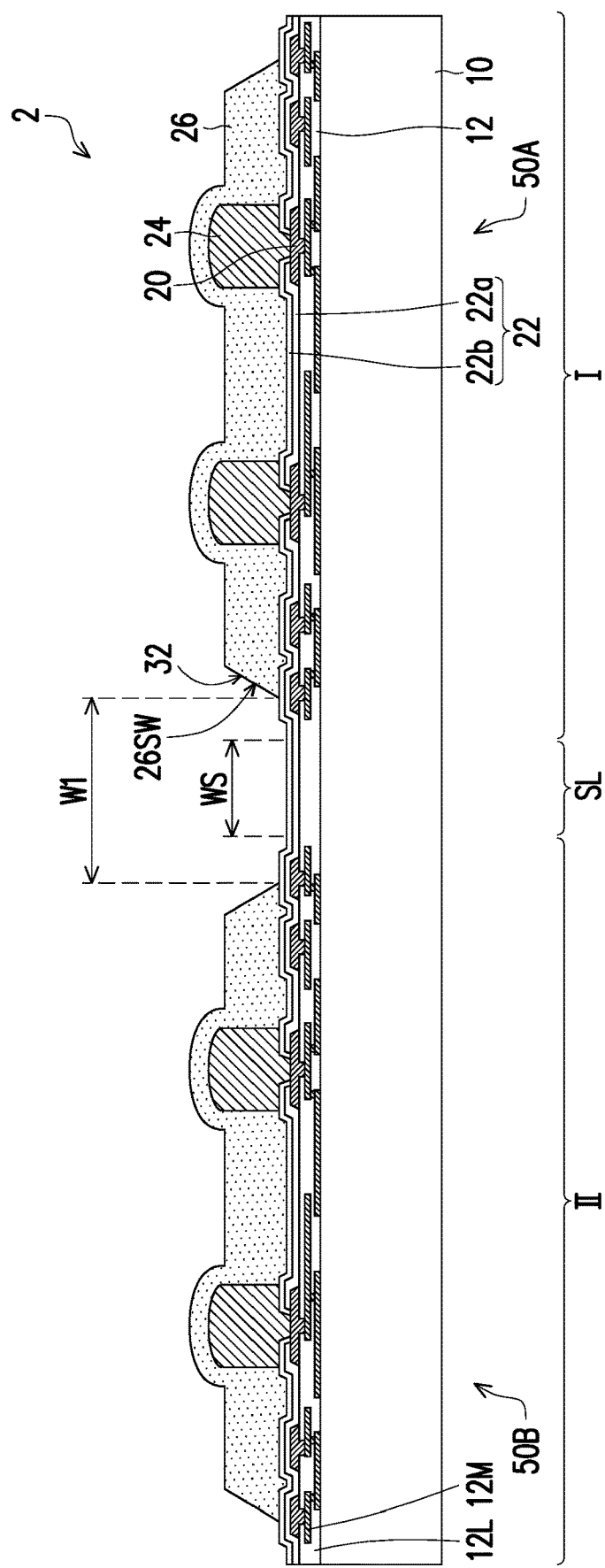

A patterning process may then be performed to remove at least a portion of the dielectric layer 26 to form a first trench 32 in the dielectric layer 26. The resulting structure is shown in FIG. 2B. In some embodiments, a portion of the dielectric layer 26 in a scribe line SL may be removed through the patterning process. In some embodiments, the dielectric layer 26 includes photo sensitive material, and exposing process and a developing process may be performed to form a recess in the dielectric layer 26, i.e., the first trench 32. A post-development baking process and curing process may then be performed. In some embodiments, the passivation layer 22 in the scribe line SL under the dielectric layer 26 may be exposed after removing the portion of the dielectric layer 26. Under another perspective, sidewalls 26SW of the dielectric layer 26 may be formed through the patterning process. The sidewalls 26SW of the dielectric layer 26 may also be viewed as the sidewalls of the first trench 32.

Figure 3:
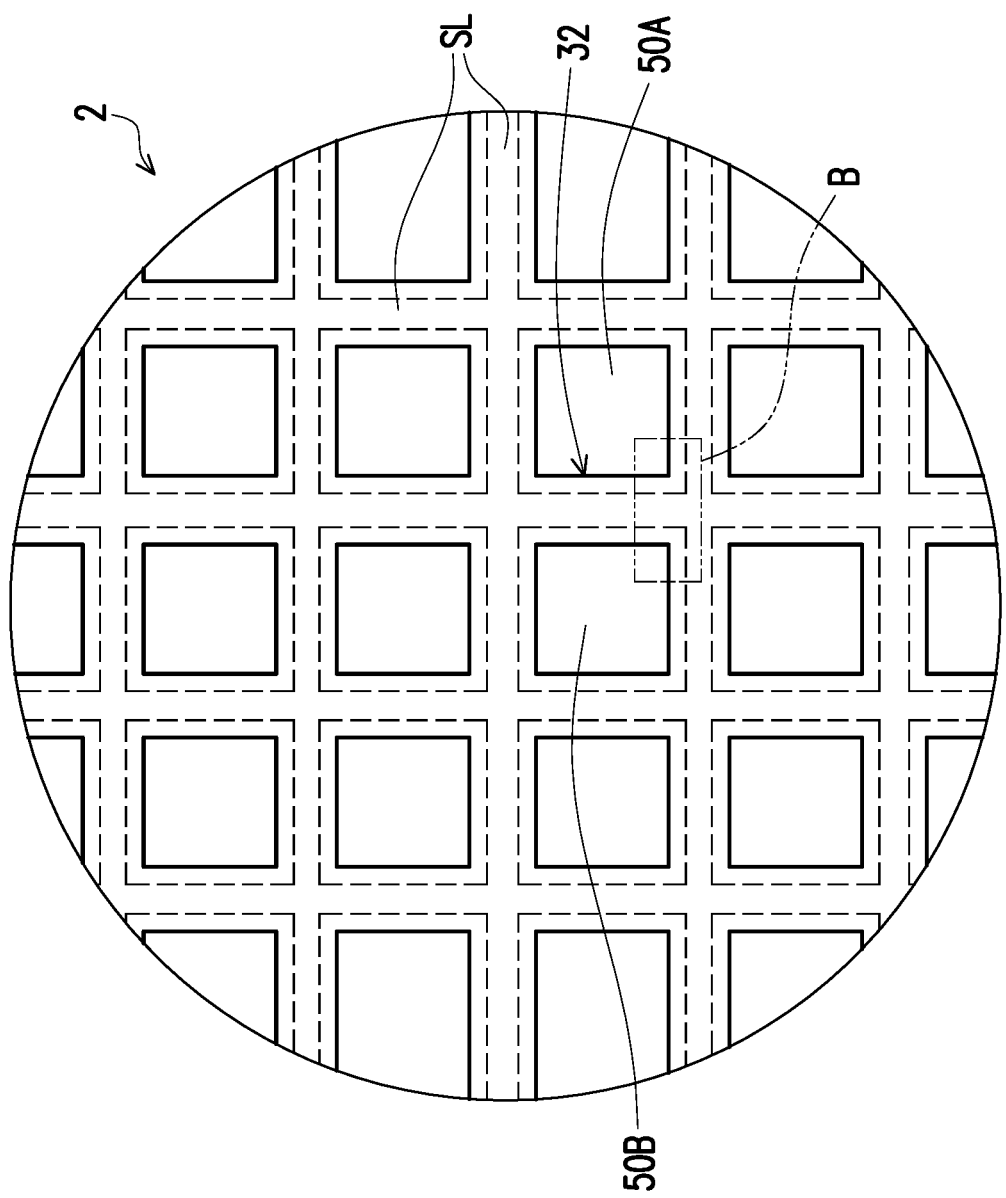
FIG. 3 is a top view of the wafer of FIG. 2C in accordance with some embodiments of the present disclosure.

A top view of the wafer 2 of FIG. 2B is shown in FIG. 3. Referring to FIG. 2B and FIG. 3, a plurality of first trenches 32 may be formed, and each of the first trenches 32 may extend along a scribe line SL of the wafer 2. The first trenches 32 may thus form a grid pattern in the top view. The plurality of the first trenches 32 may have cross-sectional views similar to the first trench 32 illustrated in FIG. 2B, and is not shown separately. In some embodiments, a first width W1 of the first trench 32 is larger than a width WS of the scribe line SL. In such cases, the dielectric layer 26 in the scribe line SL may be substantially removed. In some embodiments, the passivation layer 22 in the scribe line SL may be exposed by the first trench 32.

Figure 4:
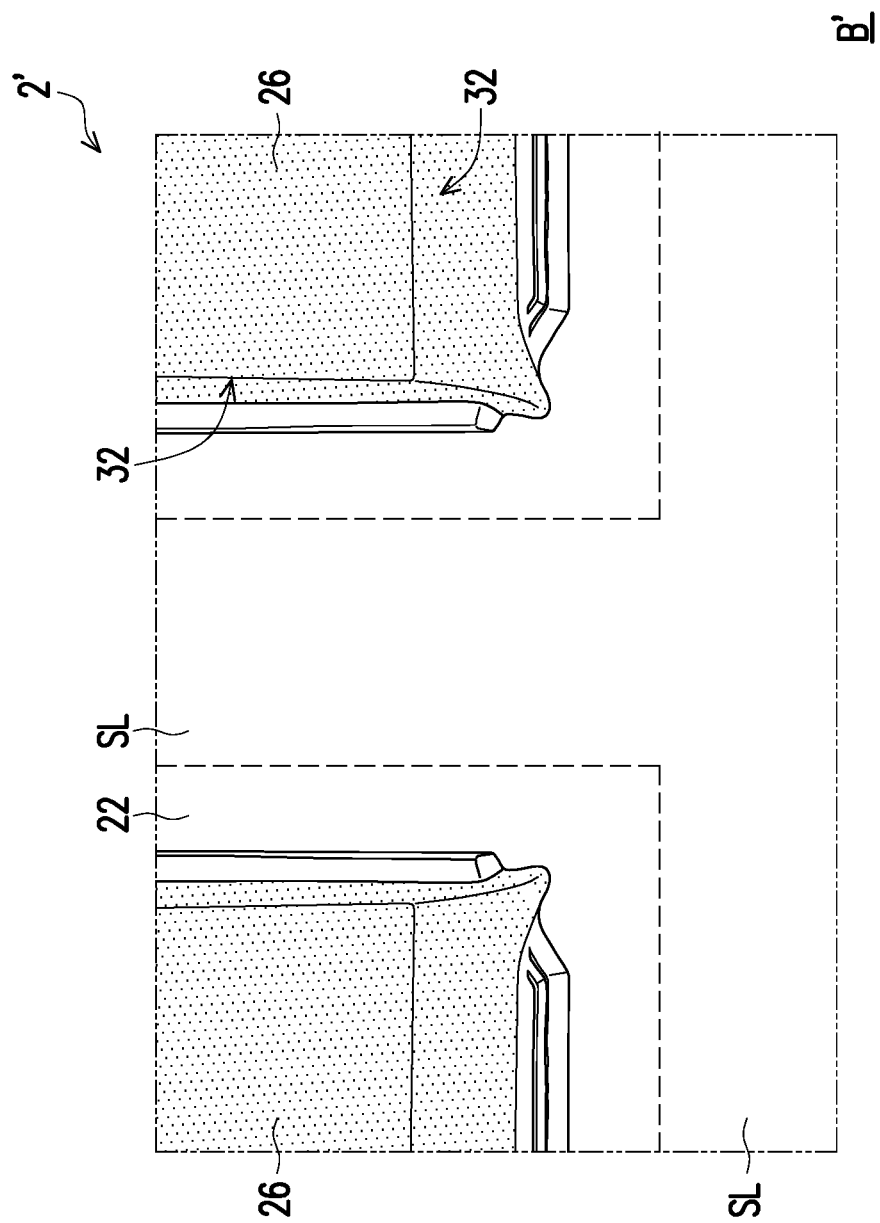
FIG. 4 is a perspective view of a wafer similar to the wafer of FIG. 2C in accordance with some embodiments of the present disclosure.

A perspective view of a wafer 2' similar to the wafer 2 of FIG. 2B is shown in FIG. 4 in accordance with some other embodiments. Referring to FIG. 4, the portion B' is similar to the portion B of the wafer 2 in FIG. 3. In FIG. 4, the passivation layer 22 in the scribe line SL is exposed to the first trench 32 in the dielectric layer 26. The portion of the passivation layer 22 alongside the scribe line SL may also be exposed to the first trench 32. For example, the exposed portion of the passivation layer 22 may be conformal with the underlying structures, such as conductive lines or conductive pads.

Figure 5:
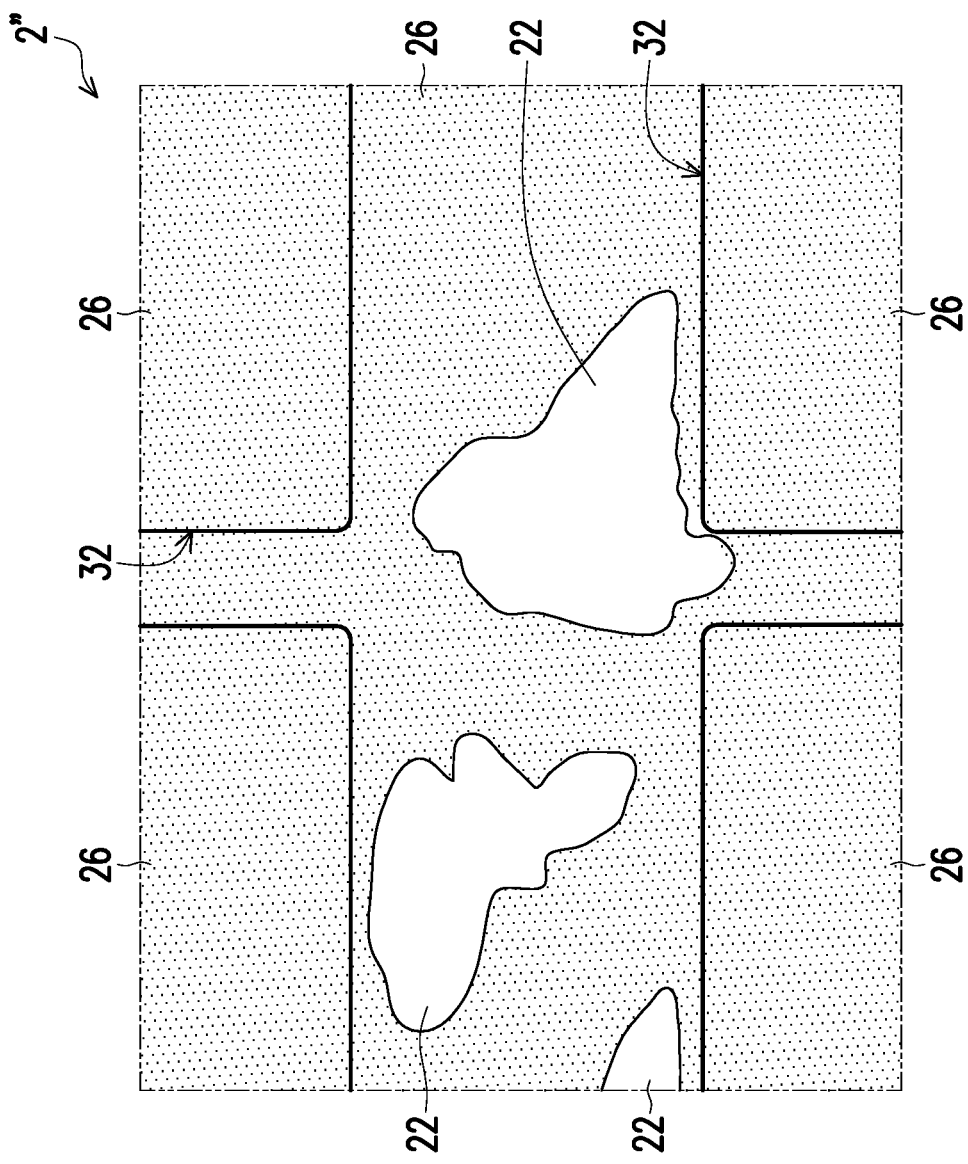
FIG. 5 is a top view of the of a wafer similar to the wafer of FIG. 2C in accordance with some embodiments of the present disclosure.

A top view of the of a wafer 2" similar to the wafer 2 of FIG. 2B and FIG. 3 is shown in FIG. 5 in accordance with some other embodiments. Referring to FIG. 5, a first trench 32 is formed through a patterning process, by which a substantially amount of the dielectric layer 26 is removed. However, at least some material of the dielectric layer 26 may remain on the passivation layer 22 after the patterning process, such that the underlying passivation layer 22 is exposed only in some "depression areas" in the first trench 32. In some other embodiments, a layer of the dielectric layer 26 may be remained in the first trench 32 and the passivation layer 22 is not exposed by the first trench 32.

Figure 2C:
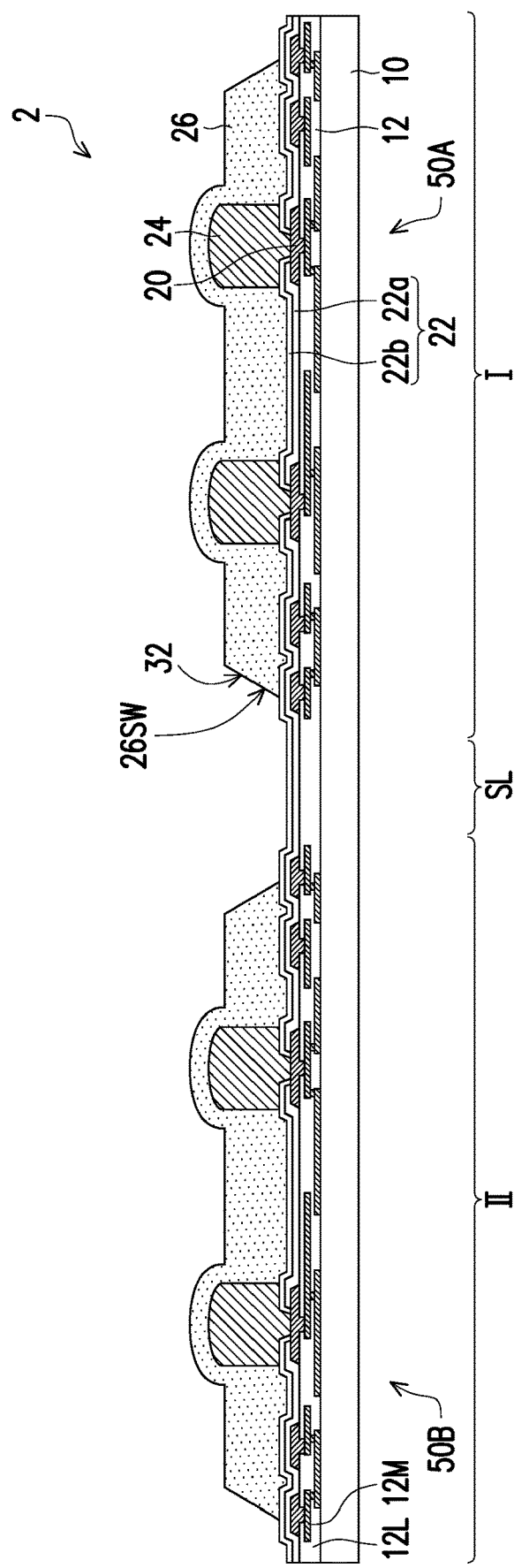

A backside grinding may then be performed to reduce the thickness of the wafer 2, and the resulting structure is shown in FIG. 2C. The backside grinding may be performed, for example, by attaching the top side of wafer 2 to a carrier (not shown), and performing a mechanical grinding or Chemical Mechanical Polish (CMP) on the backside of the semiconductor substrate 10. The thickness of semiconductor substrate 10 may be reduced to about 20 microns to several hundred microns, for example.

Figure 2D:
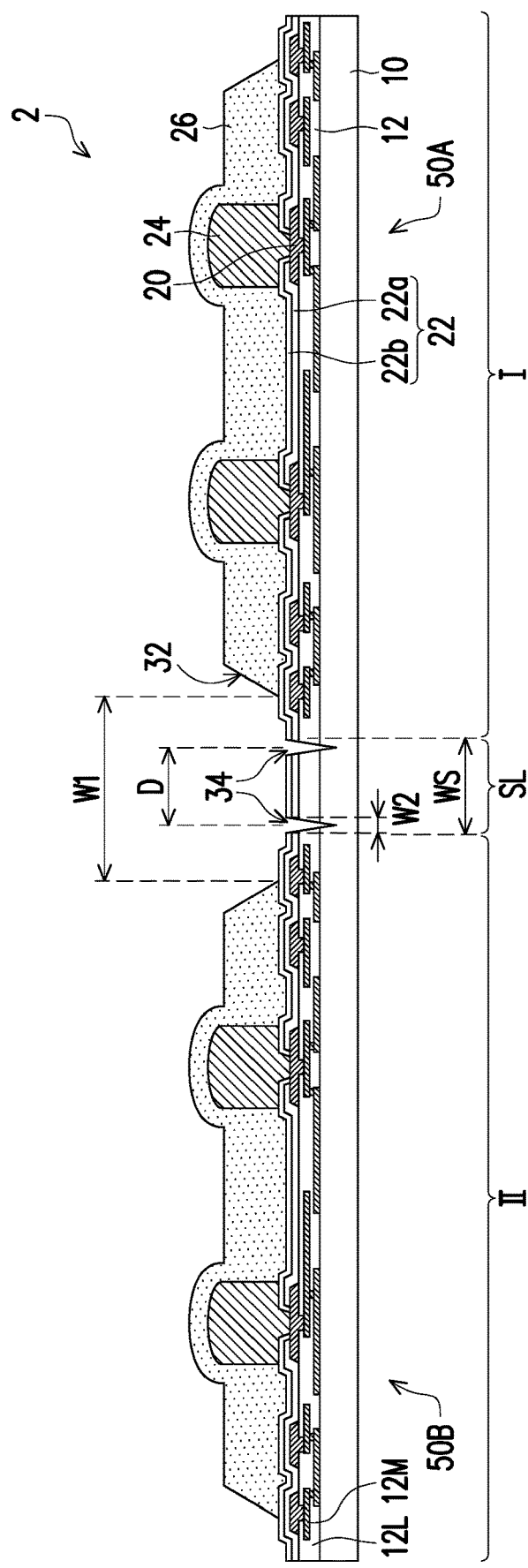

Referring to FIG. 2D, the wafer 2 is grooved. The grooving may be performed by projecting a laser beam on the wafer 2 to burn-out some portions of wafer 2 in the scribe line SL. In some embodiments, a portion of the passivation layer 22 and the interconnect structure 12 may be burnt-out by the laser beam. A second trench 34 may be formed in the wafer 2 through the grooving process. The second trench 34 may be located in the scribe line SL and extend along the scribe line SL. In some embodiments, a plurality of the second trenches 34 may be formed and each of the second trenches 34 may be located in and extend along a scribe line SL of the wafer 2.

The first trench 32 may be located above the second trench 34, and the first trench 32 may overlap with the second trench 34. Specifically, the first trench 32 may extend through the dielectric layer 26, and the second trench 34 may extend through the passivation layer 22 and may further penetrate through the interconnect structure 12 to reach the semiconductor substrate 10. Accordingly, a top surface of semiconductor substrate 10, which is recessed by the laser beam, may be exposed to the second trench 34. In a situation where a first trench 32 is formed before the grooving process, a laser with lower energy density may be used in the grooving process, therefore, the possibility of delamination in the device dies 50A and 50B may be reduced and a better yield rate may be achieved.

In some embodiments, the grooving process is performed by projecting a laser beam on the upper surface of the passivation layer 22 exposed by the first trench 32. Therefore, the first width W1 of the first trench 32 may be larger than a second width W2 of the second trench 34. In some embodiments, the second width W2 of the second trench 34 may be in a range from about 5 μm to about 15 μm, and the ratio between the first width W1 of the first trench 32 and the second width W2 of the second trench 34 may be in a range from about 4 to about 40. In the embodiment shown in FIG. 2D, two second trenches 34 are formed, and both of the second trenches 34 are located in the scribe line SL. In some embodiments, the width WS of the scribe line SL may be larger than or substantially equal to the distance D between the two second trenches 34, and the first width W1 of the first trench 32 may also be larger than the distance D between the two second trenches 34. In some other embodiments, the second trenches 34 may overlap with the border line of the scribe line SL.

Figure 2E:
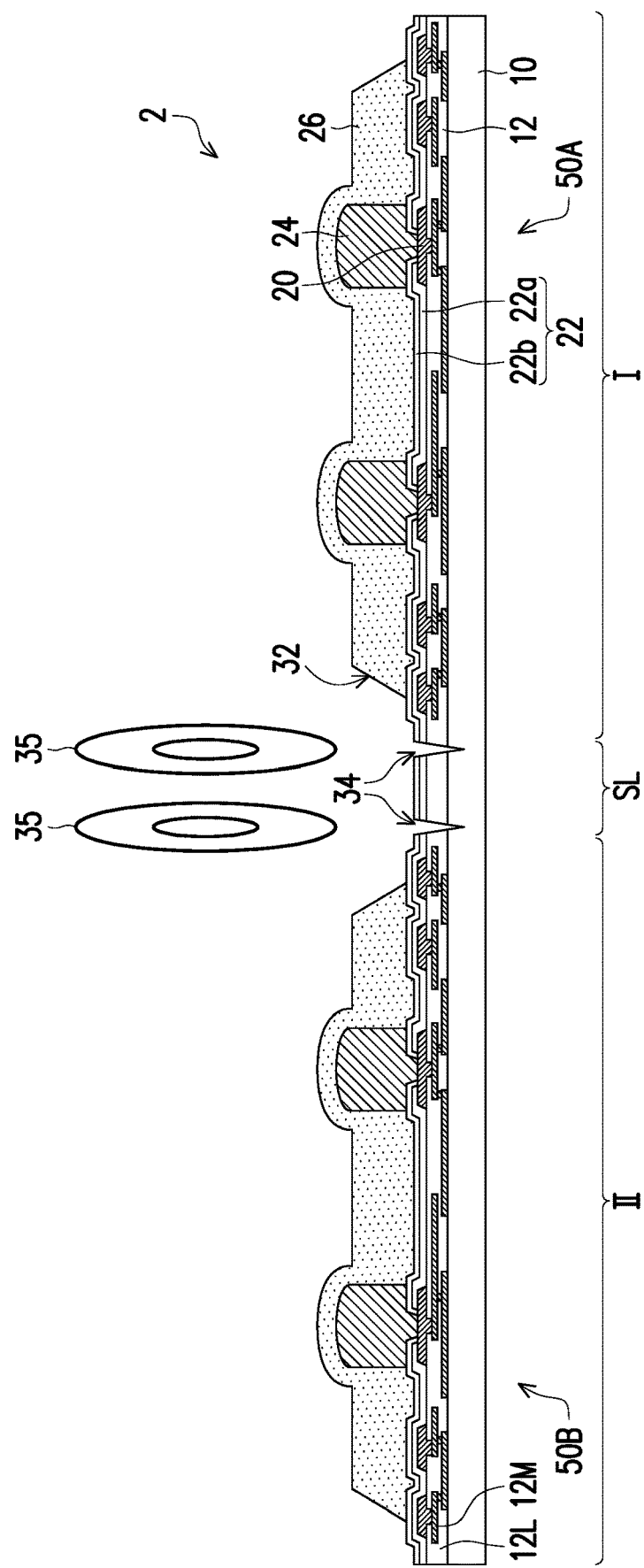
Figure 2F:
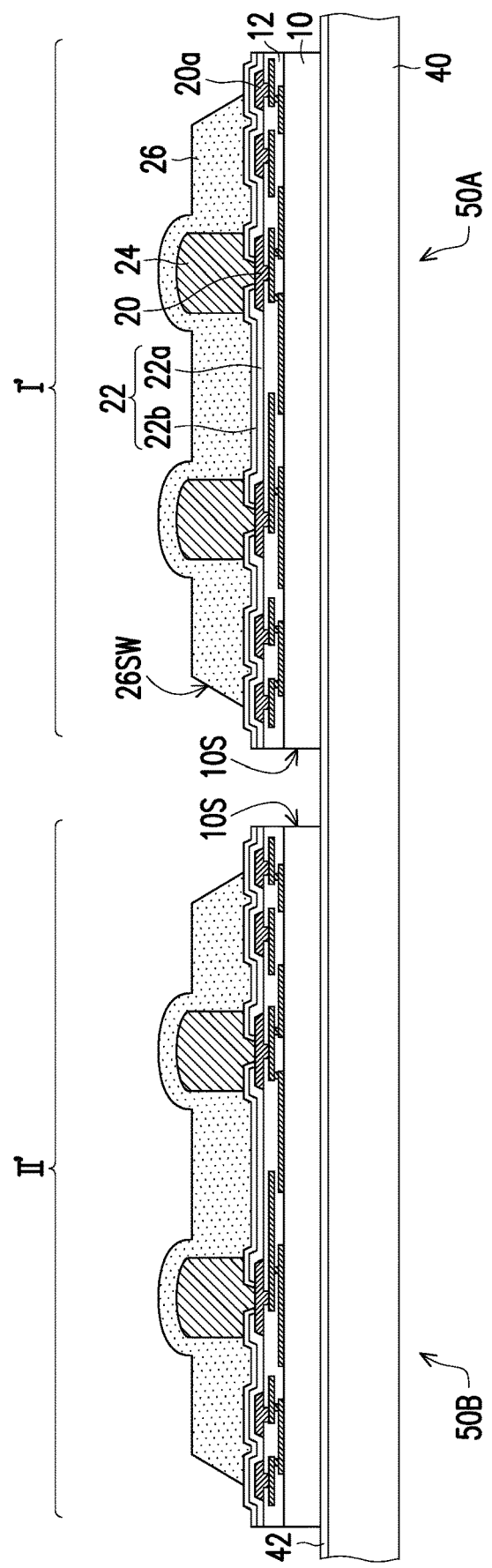

FIG. 2E illustrates the singulation (die-saw) process of the wafer 2. The singulation process may be performed on the scribe line SL to separate the wafer 2 into a plurality of device dies (i.e. device dies 50A and 50B and etc.). The singulation process may be performed along the second trenches 34, for example, by using a blade 35 to remove at least a portion of the semiconductor substrate 10 underlying the second trench 34 so as to form sidewalls 10S of the semiconductor substrate 10 (as shown in FIG. 2F). The resulting device dies 50A and 50B may include logic dies (e.g., Central Processing Unit (CPU) dies, Graphic Processing Unit (GPU) dies, microcontroller, etc.), memory dies (e.g., dynamic random access memory (DRAM) dies, static random access memory (SRAM) dies, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof.

Referring to FIG. 2F, a carrier 40 is provided, and a release layer 42 is disposed over the carrier 40. The carrier 40 may be a blank glass carrier, a blank ceramic carrier, a wafer, or the like, and may have a shape of a semiconductor wafer with a round top-view shape. The carrier 40 is sometimes referred to as a carrier wafer. The release layer 42 may be formed of a Light-to-Heat Conversion (LTHC) material, for example, although other types of adhesives may be used. In accordance with some embodiments of the present disclosure, the release layer 42 is capable of decomposing under the heat of light, and hence can release carrier 40 from the structure formed thereon.

The device dies 50A and 50B may be adhered to the release layer 42 by an adhesive (not shown). As shown in FIG. 2F, each of the device dies 50A and 50B is adhered in a package regions I' and II'. In other embodiments, more device dies may be adhered in one region. Electrical connectors (not shown) may be formed before adhering the device dies 50A and 50B to the release layer 42. It is appreciated that the packaging is performed at the wafer level, and although the device dies 50A and 50B are illustrated, a plurality of device dies may be placed over the carrier 40, wherein the plurality of the placed device dies are arranged as an array including a plurality of rows and a plurality of columns.

Figure 2G:
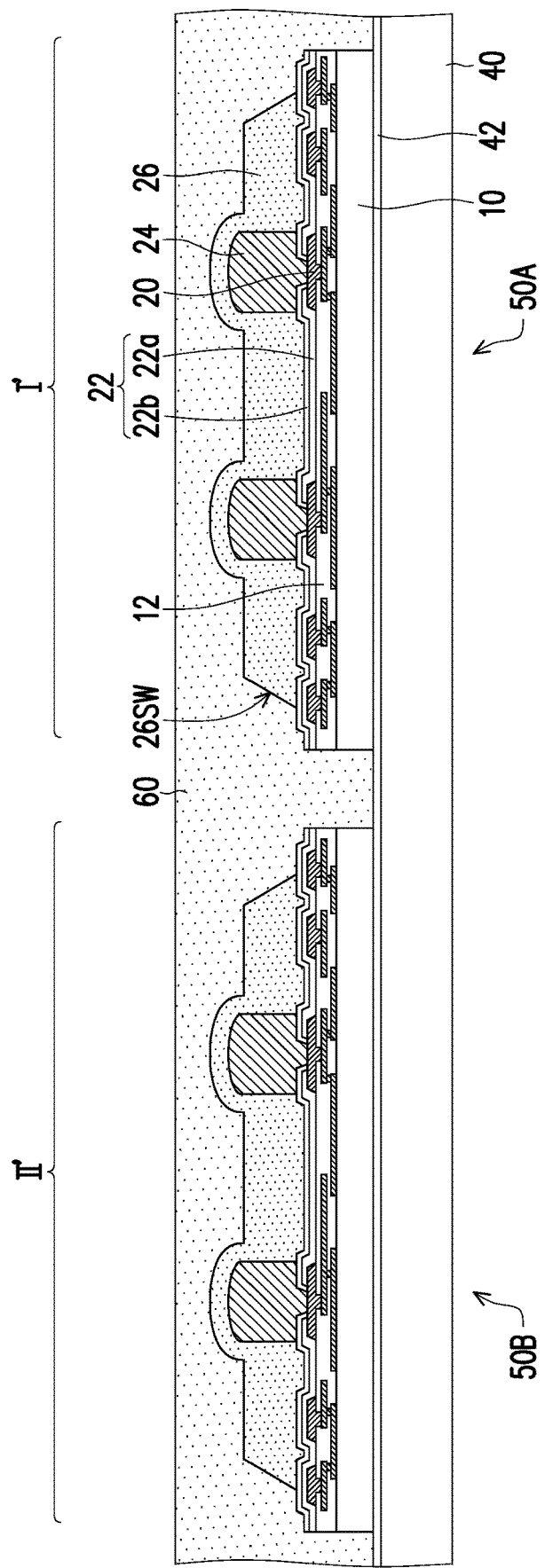

Referring to FIG. 2G, an encapsulant 60 may be formed on the device dies 50A and 50B. The encapsulant 60 may be a molding compound, epoxy, or the like, and may be applied by compression molding, transfer molding, or the like. The top surface of encapsulant 60 may be higher than the top ends of the conductive vias 24.

Figure 2H:
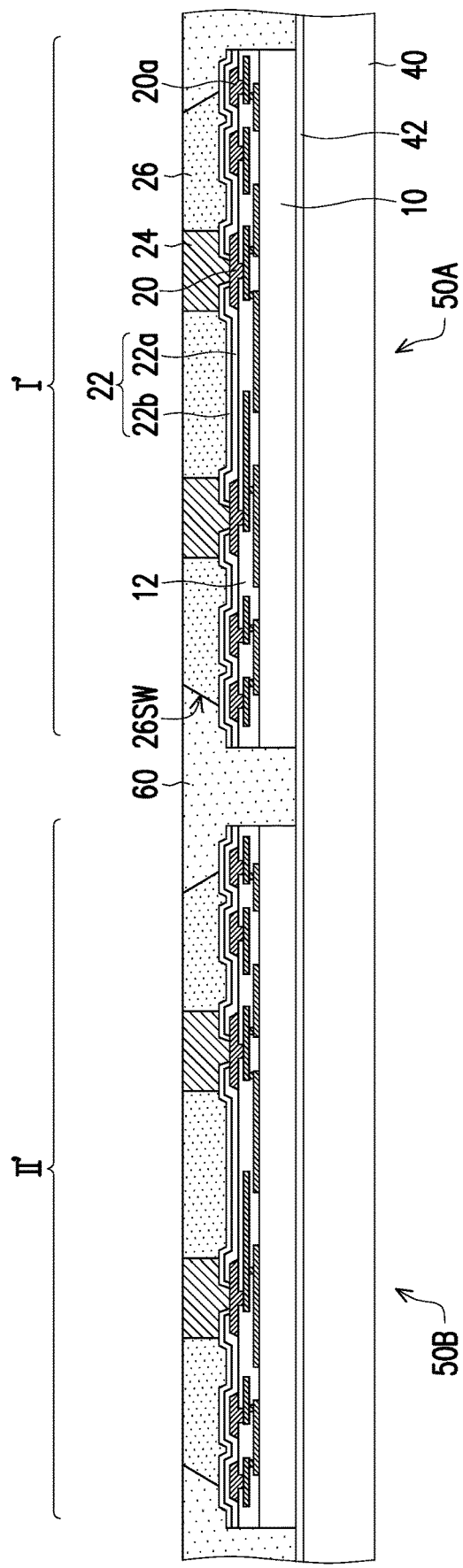

Referring to FIG. 2H, after curing, a planarization step such as a CMP step or a grinding step may be performed to planarize the encapsulant 60 to expose the conductive vias 24. Top surfaces of the conductive vias 24 and the encapsulant 60 are level after the grinding process. In some embodiments, the grinding may be omitted, for example, if the conductive vias 24 are already exposed.

Figure 2I:
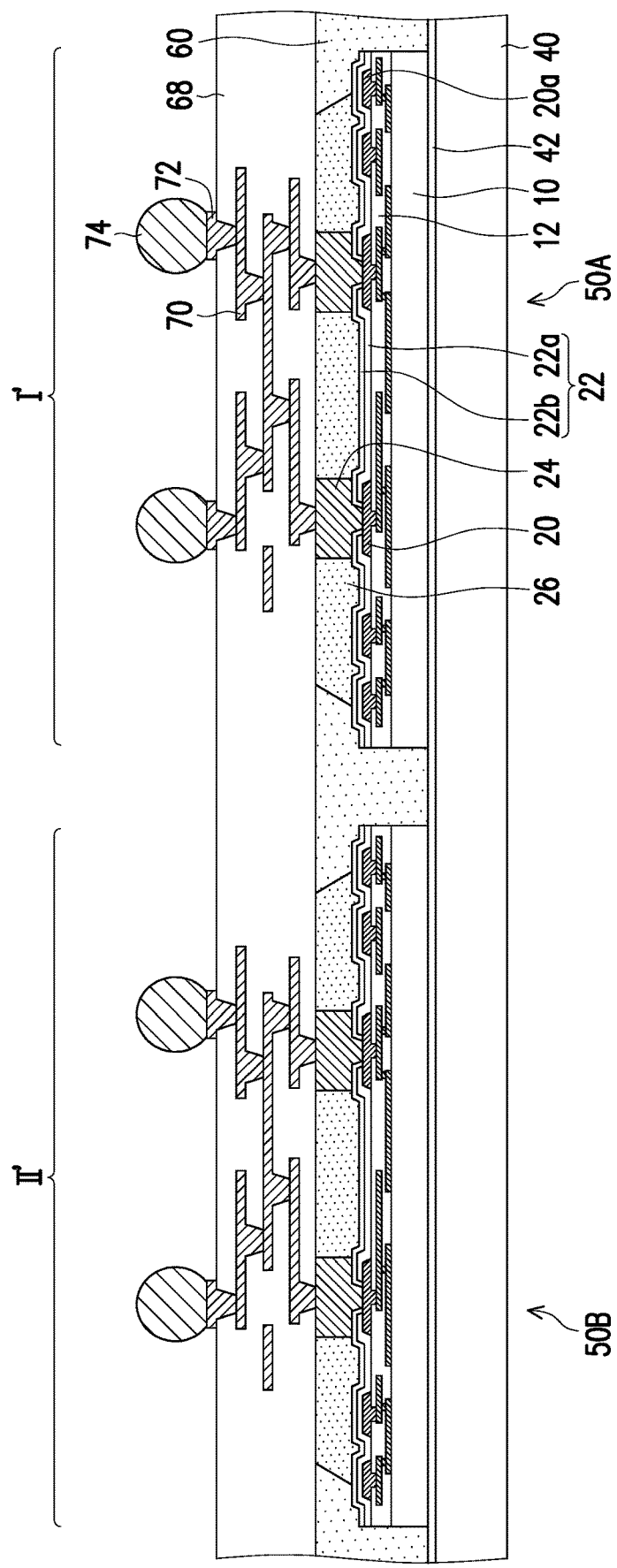

Referring to FIG. 2I, one or more layers of dielectric layers 68 and the respective redistribution lines (RDLs) 70 are formed over the encapsulant 60 and the conductive vias 24. The RDLs 70 are referred to as front side RDLs since they are on the front side of the device dies 50A and 50B. In accordance with some embodiments of the present disclosure, the dielectric layers 68 are formed of a polymer(s) such as PBO, polyimide, or the like. In accordance with alternative embodiments of the present disclosure, the dielectric layers 68 are formed of an inorganic dielectric material(s) such as silicon nitride, silicon oxide, silicon oxynitride, or the like.

The RDLs 70 may be formed to electrically couple to the conductive vias 24 and the electrical connectors (if there is any), and may interconnect the conductive vias 24 and the electrical connectors. The RDLs 70 may include metal traces (metal lines) and vias underlying and connected to the metal traces. In accordance with some embodiments of the present disclosure, the RDLs 70 are formed through plating processes, wherein each layer of the RDLs 70 includes a seed layer (not shown) and a plated metallic material over the seed layer. The seed layer and the plated metallic material may be formed of the same material or different materials. Under-Bump Metallurgies (UBMs) 72 may then be formed to extend into the top layer of the dielectric layer 68 and in contact with the metal pads in the top layer of the RDLs 70.

Electrical connectors 74 may be formed on UBMs 72. The formation of the electrical connectors 74 may include placing solder balls over RDLs 70 and then reflowing the solder balls. In accordance with alternative embodiments of the present disclosure, the formation of the electrical connectors 74 includes performing a plating step to form solder regions over RDLs 70 and then reflowing the solder regions. The electrical connectors 74 may also include metal pillars, or metal pillars and solder caps, which may also be formed through plating.

Figure 2J:
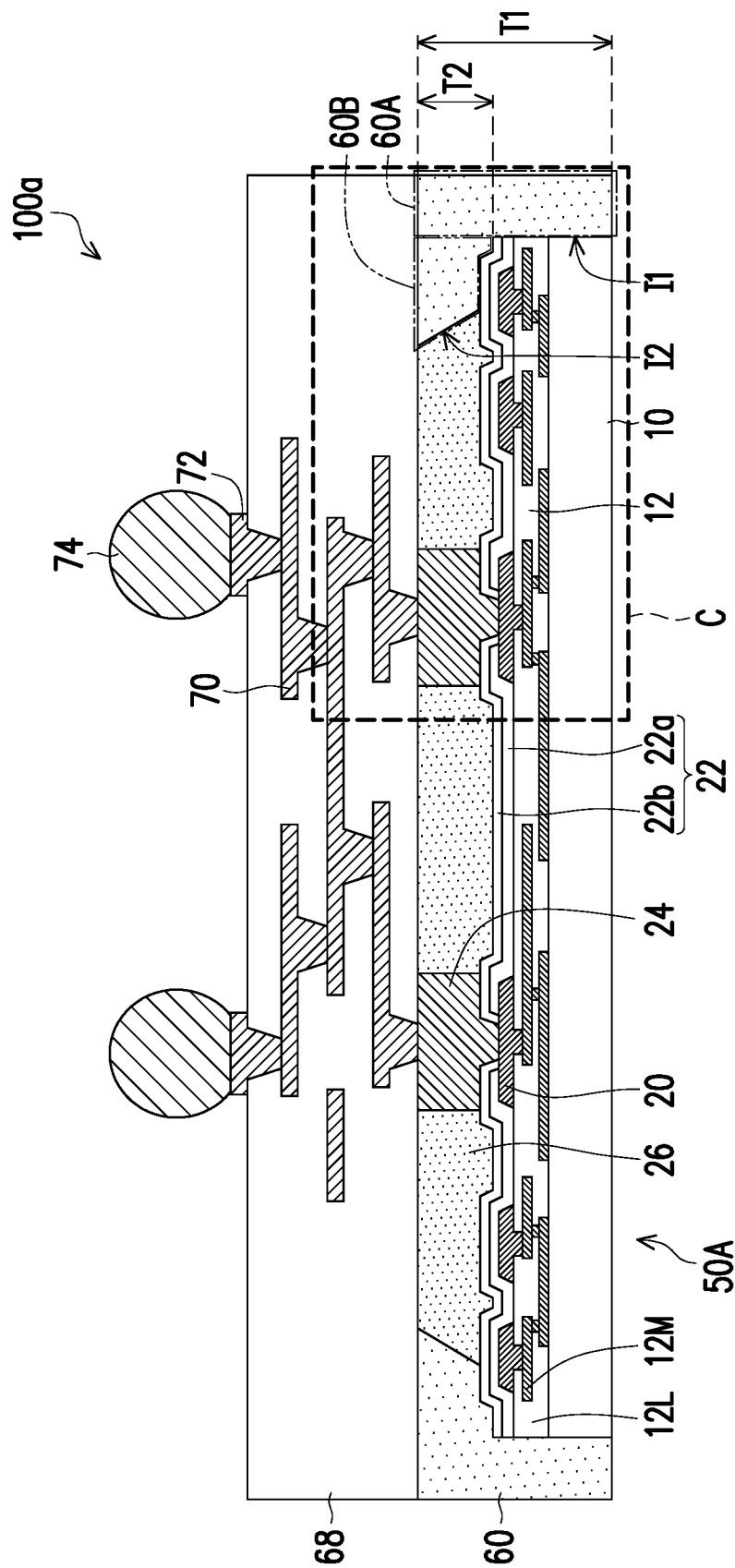

In FIG. 2J, a carrier de-bonding is performed to detach (de-bond) the carrier 40 from the device dies 50A and 50B and the encapsulant 60. In accordance with some embodiments, the de-bonding includes projecting a light such as a laser light or an UV light on the release layer 42 so that the release layer 42 decomposes under the heat of the light and the carrier 40 can be removed. A singulation process may then be performed to separates the package region I' from the package region II'. FIG. 2J illustrates a resulting, singulated package 100a, which may be from the package region I'. The package 100a may also be referred to as an integrated fan-out (InFO) package 100a.

Figure 6:
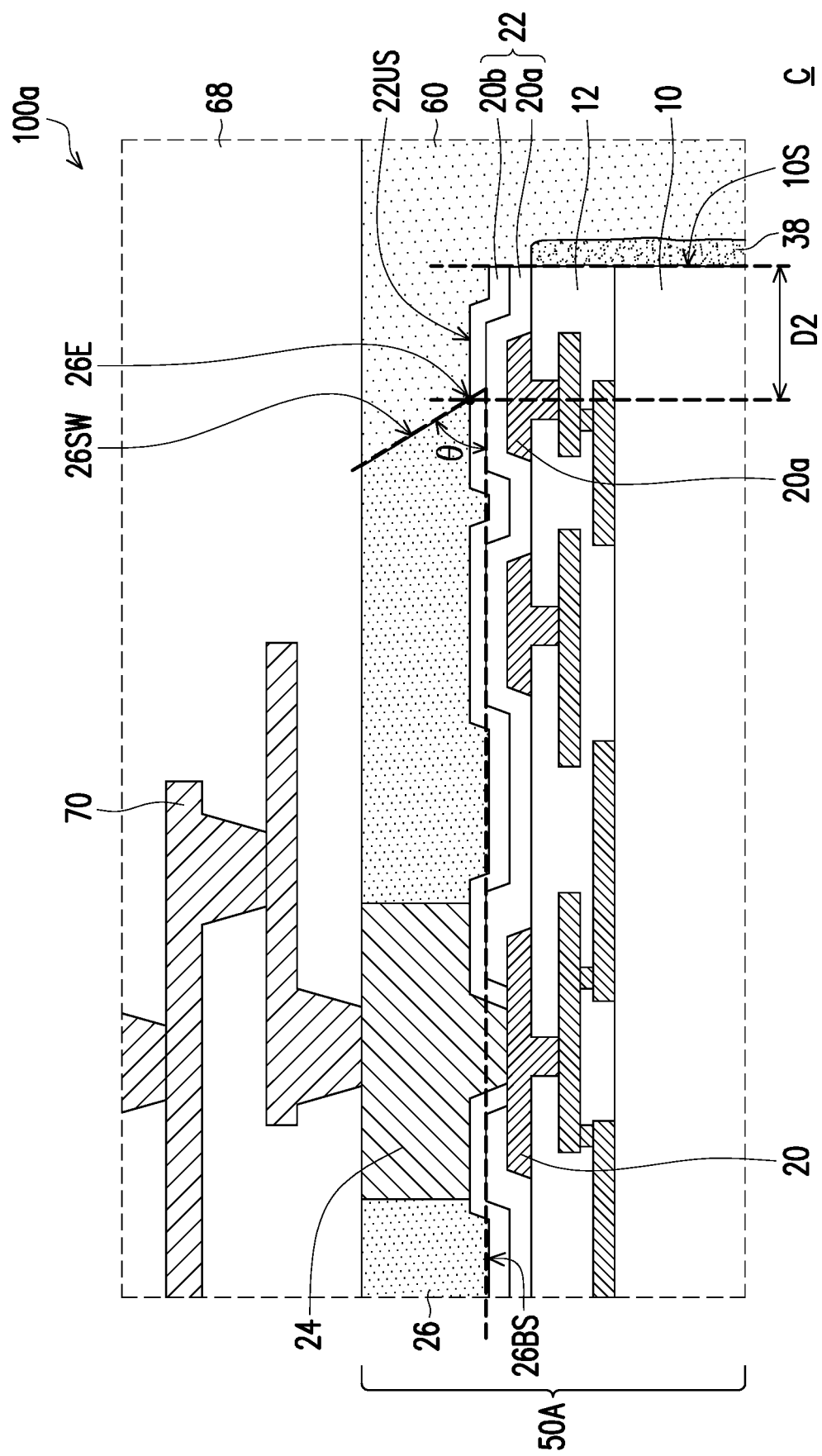
FIG. 6 is a cross-sectional view of a portion of the package of FIG. 2J in accordance with some embodiments.

FIG. 6 illustrates the portion C of the package 100a in FIG. 2J in accordance with some embodiments. Referring to FIG. 2J and FIG. 6, the package 100a may include a device die 50A, an encapsulant 60, and RDLs 70. The encapsulant 60 may laterally encapsulate the device die 50A.

The device die 50A may include a semiconductor substrate 10, an interconnect structure 12, conductive pads 20, a passivation layer 22, conductive vias 24, and a dielectric layer 26. The interconnect structure 12 may be disposed over the semiconductor substrate 10. The conductive pads 20 are disposed over the interconnect structure 12. The conductive vias 24 may be disposed over the interconnect structure 12, and electrically coupled to the interconnect structure 12 through an underlying conductive pad 20. The dielectric layer 26 may be disposed over the interconnect structure 12 and laterally encapsulates the conductive via 24. The passivation layer 22 may be disposed between the dielectric layer 26 and the interconnect structure 12.

In some embodiments, the dielectric layer 26 includes a sidewall 26SW and a bottom surface 26BS. The bottom surface 26BS of the dielectric layer 26 is a surface of the dielectric layer 26 facing the interconnect structure 12. The bottom surface 26BS of the dielectric layer 26 may be conformal with the underlying conductive pads 20, such that the bottom surface 26BS of the dielectric layer 26 may include a plurality of bump area surrounded by a substantially planer surface. In some embodiments, the sidewall 26SW of the dielectric layer 26 is tilted with respect to the bottom surface 26BS of the dielectric layer 26, i.e., the substantially planer surface of the bottom surface 26BS as shown in dotted line in FIG. 6. In other words, the sidewall 26SW of the dielectric layer 26 is not substantially perpendicular to the bottom surface 26BS of the dielectric layer 26. In some embodiments, an angle θ between the sidewall 26SW of the dielectric layer 26 and the bottom surface 26BS of the dielectric layer 26 may be in a range from about 40 degrees to less than about 90 degrees. In some embodiments, the angle θ may be in a range from about 75 degrees to 90 degrees, although different angles may be adopted. The angle θ between the sidewall 26SW and the bottom surface 26BS of the dielectric layer 26 may be controlled by adjusting the parameters and/or conditions of the exposure process.

The dielectric layer 26 may be "retracted" from the sidewall 10S of the semiconductor substrate 10. In the embodiment shown in FIG. 6, the conductive pads 20 may include an outermost conductive pad 20a having the shortest distance therefrom to the sidewall 10S of the semiconductor substrate 10. As shown in FIG. 6, a bottom edge 26E of the dielectric layer 26, which is an edge of the bottom surface 26BS of the dielectric layer 26, overlaps the outermost conductive pad 20a. In some embodiments, the bottom edge 26E of the dielectric layer 26 is aligned with a center of the outermost conductive pad 20a, such that a lateral distance D1 between the bottom edge 26E of the dielectric layer 26 and the center of the outermost conductive pad 20a is about 0.

The passivation layer 22 may include an upper surface 22US, which is a surface of the passivation layer 22 facing the dielectric layer 26, wherein the upper surface 22US of the passivation layer 22 may be covered by the dielectric layer 26. In some embodiments, a portion of the upper surface 22US of the passivation layer 22 is not covered by the dielectric layer 26 and is in contact with the encapsulant 60. A lateral distance D2 between the dielectric layer 26 and the sidewall 10S of the semiconductor substrate 10 is in the range from about 2 microns to about 15 microns.

Further, in some embodiments, the package 100a may include some semiconductor debris 38 disposed between the interconnect structure 12 and the encapsulant 60. The semiconductor debris 38 may be debris resulting from the singulation process in which a portion of the semiconductor substrate 10 is removed. In some embodiments, the dielectric layer 26 is laterally distanced from the semiconductor debris.

From another perspective, the encapsulant 60 may include a first portion of the encapsulant 60A and a second portion of the encapsulant 60B. The second portion of the encapsulant 60B may be disposed between the first portion of the encapsulant 60A and the dielectric layer 26, and the second portion of the encapsulant 60B extends from the first portion of the encapsulant 60A to the dielectric layer 26. As shown in FIG. 2J and FIG. 6, the top surface of the first portion of the encapsulant 60A and the top surface of the second portion of the encapsulant 60B may be coplanar, and the thickness T1 of the first portion of the encapsulant 60A may be greater than the thickness T2 of the second portion of the encapsulant 60B. In some embodiments, the second portion of the encapsulant 60B is over the semiconductor substrate 10 and overlaps the semiconductor substrate 10, and the upper surface 22US of the passivation layer 22 may be in contact with the second portion of the encapsulant 60B. In other words, in such cases, the encapsulant 60 extends laterally above the semiconductor substrate 10 such that at least a portion of the encapsulant 60 is directly above the semiconductor substrate 10. As shown in FIG. 2J and FIG. 6, in some embodiments, the second portion of the encapsulant 60B overlaps the outermost conductive pad 20a.

The package 100a may include a first interface I1 between the first portion of the encapsulant 60A and the semiconductor substrate 10 and a second interface I2 between the second portion of the encapsulant 60B and the dielectric layer 26. In some embodiments, the first interface I1 is laterally distanced from the second interface I2. And in some embodiments, the second interface I2 is smoother than the first interface I1.

Figure 7:
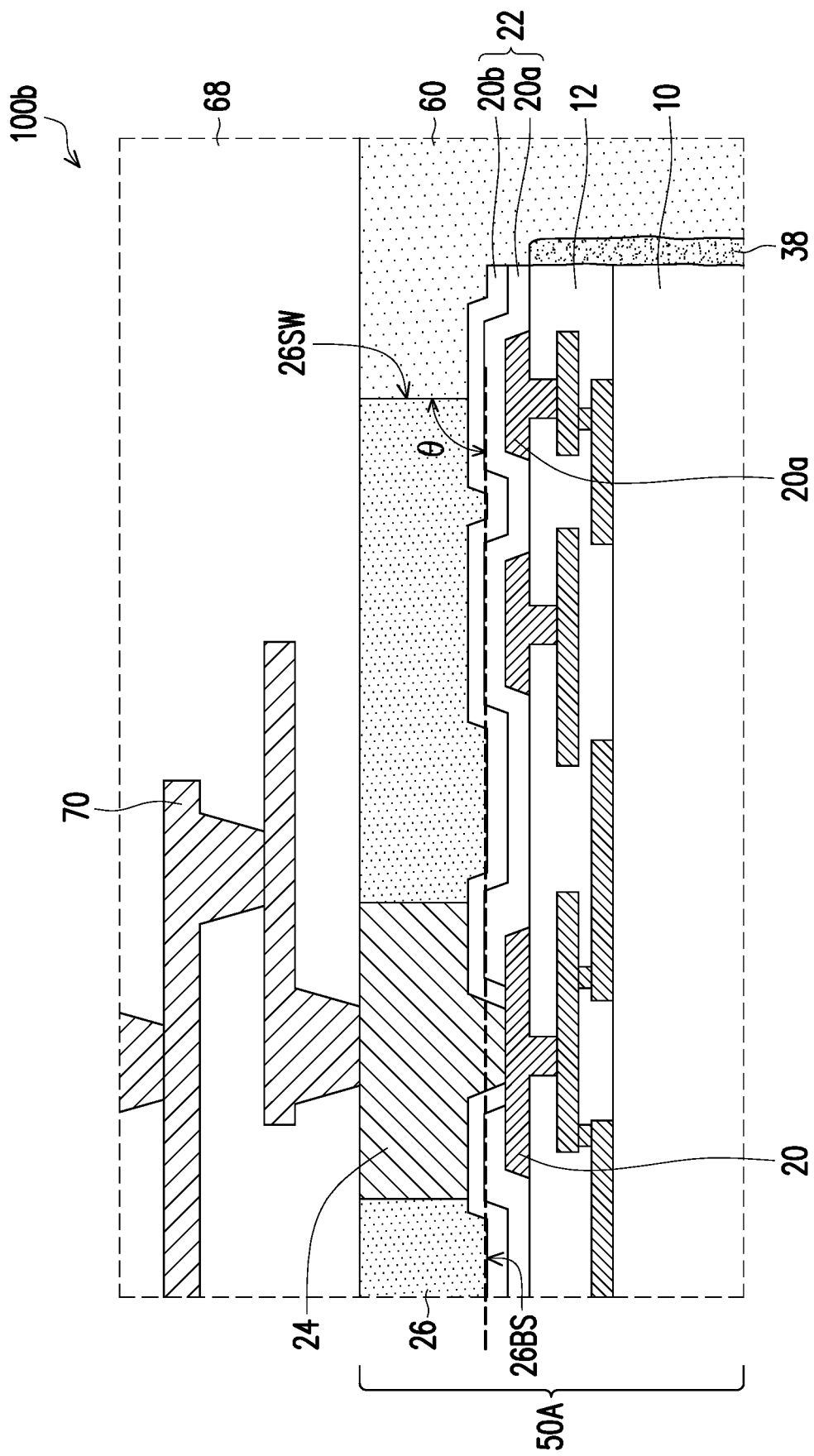
FIG. 7 is a cross-sectional view of a portion of a package in accordance with some embodiments.

FIG. 7 is a cross-sectional view of a portion of another package 100b in accordance with some embodiments. The package 100b in FIG. 7 may be similar to the package 100a illustrated in FIGS. 2J and 6 except that in the package 100b, the sidewall 26SW of the dielectric layer 26 is substantially perpendicular with respect to the bottom surface 26BS of the dielectric layer 26. In other words, the angle θ between the sidewall 26SW of the dielectric layer 26 and the bottom surface 26BS of the dielectric layer 26 is about 90 degrees. Details regarding this embodiment that are similar to those for the previously described embodiment will not be repeated herein.

Figure 8:
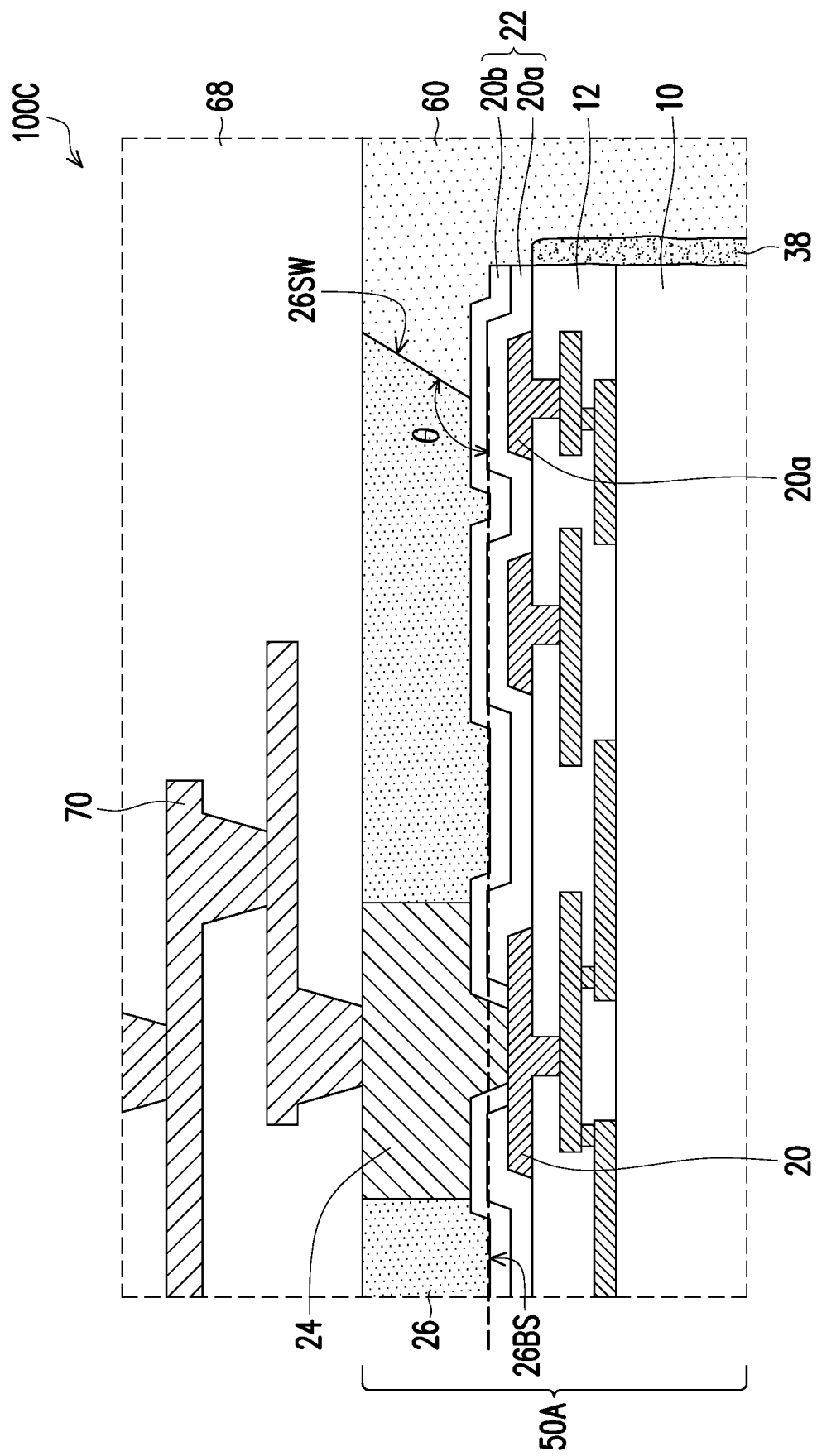
FIG. 8 is a cross-sectional view of a portion of a package in accordance with some embodiments.

FIG. 8 is a cross-sectional view of a portion of another package 100c in accordance with some embodiments. The package 100c in FIG. 8 may be similar to the package 100a illustrated in FIGS. 2J and 6 except that in the package 100c, the sidewall 26SW of the dielectric layer 26 is tilted toward the upper surface 22US of the passivation layer 22, such that the angle θ between the sidewall 26SW of the dielectric layer 26 and the bottom surface 26BS of the dielectric layer 26 may be in a range from larger than about 90 degrees to about 140 degrees. In some embodiments, the angle θ may be in a range from about 90 degrees to about 105 degrees, although different angles may be adopted. Details regarding this embodiment that are similar to those for the previously described embodiment will not be repeated herein.

Figure 9:
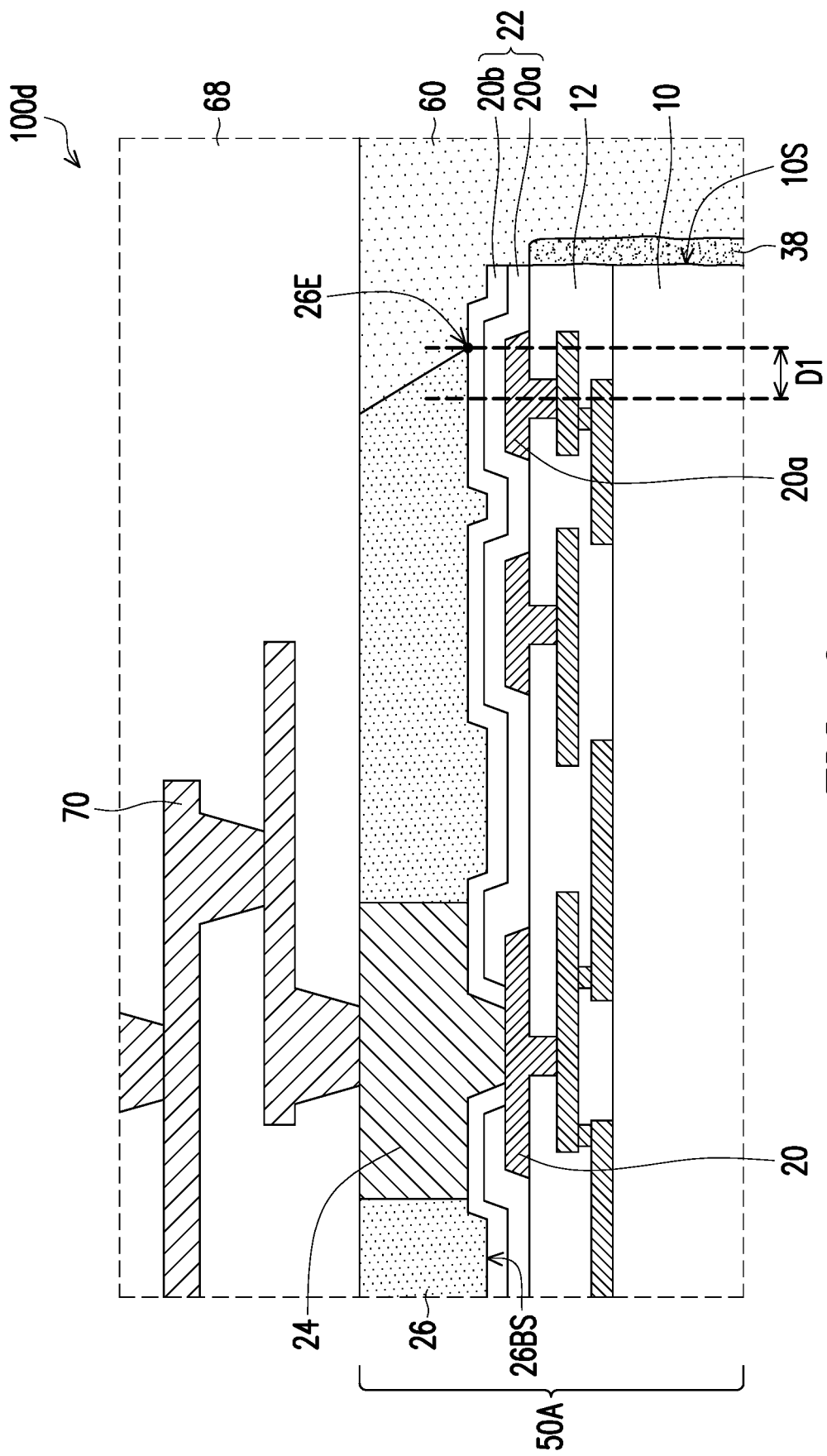
FIG. 9 is a cross-sectional view of a portion of a package in accordance with some embodiments.

FIG. 9 is a cross-sectional view of a portion of another package 100d in accordance with some embodiments. The package 100d in FIG. 9 may be similar to the package 100a illustrated in FIGS. 2J and 6 except that in the package 100d, the lateral distance D2 between the bottom edge 26E of the dielectric layer 26 and the sidewall 10S of the semiconductor substrate 10 is smaller than a lateral distance between the center of the outermost conductive pad 20a and the sidewall 10S of the semiconductor substrate 10. In such embodiments, the package 100d may include less encapsulant 60 to reduce coefficient of thermal expansion (CTE) mismatch and warpage. In some embodiments, the lateral distance D1 between the bottom edge 26E of the dielectric layer 26 and the center of the outermost conductive pad 20a is in a range from more than 0 micron to about 5 microns. Details regarding this embodiment that are similar to those for the previously described embodiment will not be repeated herein.

Figure 10:
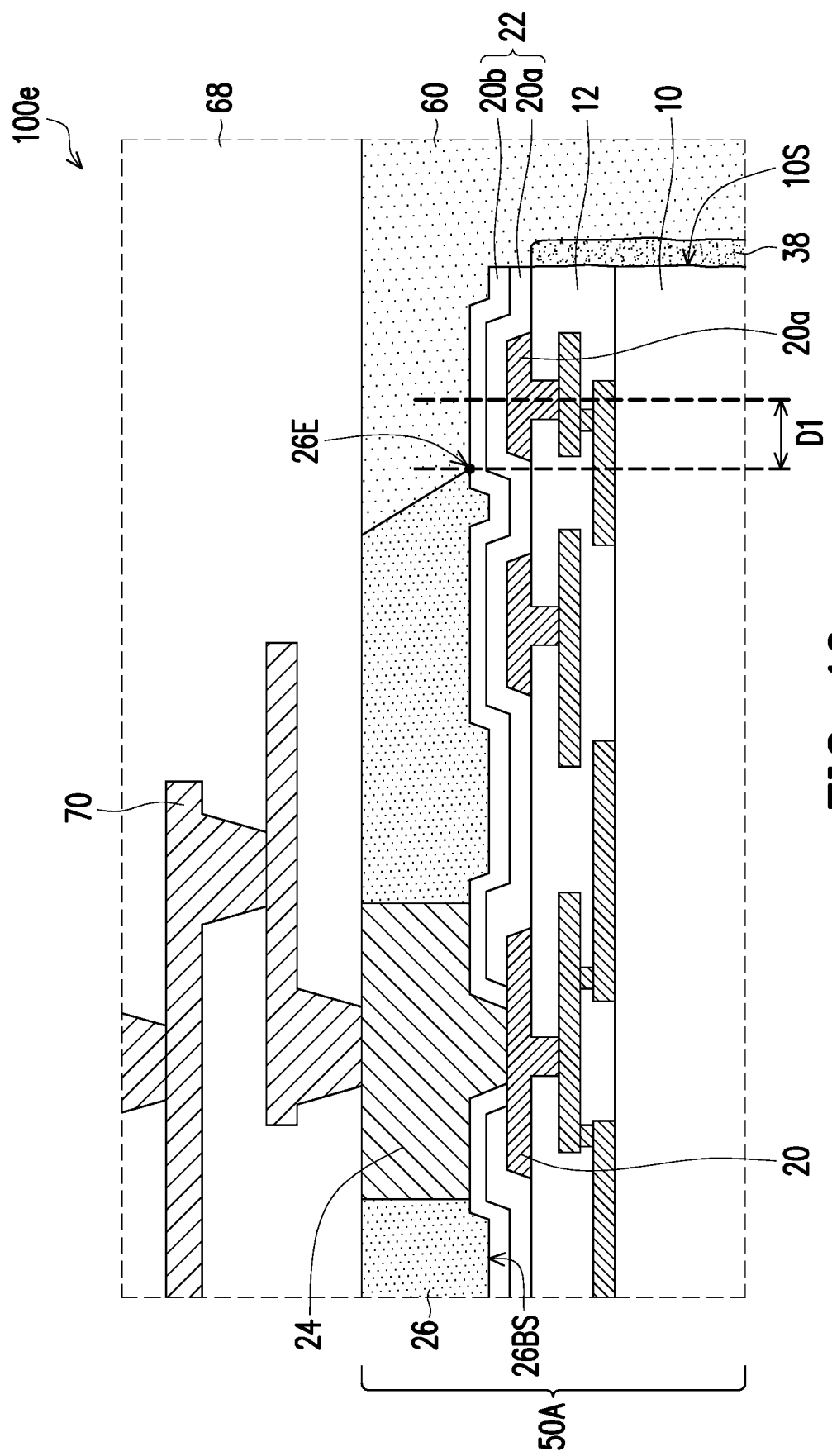
FIG. 10 is a cross-sectional view of a portion of a package in accordance with some embodiments.

FIG. 10 is a cross-sectional view of a portion of another package 100e in accordance with some embodiments. The package 100e in FIG. 10 may be similar to the package 100a illustrated in FIGS. 2J and 6 except that in the package 100e, the lateral distance D2 between the bottom edge 26E of the dielectric layer 26 and the sidewall 10S of the semiconductor substrate 10 is larger than the lateral distance between the center of the outermost conductive pad 20a and the sidewall 10S of the semiconductor substrate 10. In some embodiments, the lateral distance D1 between the bottom edge 26E of the dielectric layer 26 and the center of the outermost conductive pad 20a is in a range from more than 0 micron to about 5 microns. Details regarding this embodiment that are similar to those for the previously described embodiment will not be repeated herein.

FIG. 11A is a top view of a portion of a package 100f in accordance with some embodiments. In FIG. 11A, the dielectric layer 26 is laterally surrounded by the encapsulant 60, and the conductive vias 24 are laterally surrounded by the dielectric layer 26. The package 100f in FIG. 11A may be similar to the package 100a illustrated in FIGS. 2J and 6 except that the package 100f may further include an alignment mark 25. The alignment mark 25 may be disposed under the dielectric layer 26, for example, the alignment mark 25 may be disposed on the passivation layer 22, such that the alignment mark 25 and the conductive lines on the passivation layer 22 may be formed in the same process. The alignment mark 25 may be disposed near the bottom edge of the dielectric layer 26. In some embodiments, the alignment mark 25 is disposed in a corner region close to an intersection of the first bottom edge 26E1 of the dielectric layer 26 in a first direction X and the second bottom edge 26E2 of the dielectric layer 26 in a second direction Y. During the patterning process of the dielectric layer 26, the first trench 32 may be formed according to the alignment mark 25. In some embodiments, a distance D3 from the alignment mark 25 to the first bottom edge 26E1 may be in a range from about 0 microns to about 100 microns, and a distance D4 from the alignment mark 25 to the second bottom edge 26E2 may be in a range from about 0 microns to about 100 microns.

FIG. 11B is a top view of a portion of a package 100g in accordance with some embodiments. The package 100g in FIG. 11B may be similar to the package 100f illustrated in FIG. 11A except that the package 100f may further include a connecting bottom edge 26E3 in connection with the first bottom edge 26E1 of the dielectric layer 26 and the second bottom edge 26E2 of the dielectric layer 26. The connecting bottom edge 26E3 may be parallel to the pattern of the alignment mark 25, and an angle φ between the connecting bottom edge 26E3 and the first bottom edge 26E1 may be in a range form more than 0 degree to less than 90 degrees.

In the present disclosure, a portion of the dielectric layer in the scribe line may be removed before performing the grooving process for singulation of the dies, wherein the dielectric layer is disposed over the interconnect structure of the dies. As such, a laser with lower energy density may be used in the grooving process. Therefore, the possibility of delamination in the dies may be reduced and a better yield rate may be achieved. The removing of a portion of the dielectric layer may result in a tilted sidewall in the dielectric layer and a two-portion structure of the encapsulant in a package formed therefrom.

In the present disclosure, a package including a device die and an encapsulant is provided. The device die includes a semiconductor substrate, an interconnect structure, a conductive via, and a dielectric layer. The interconnect structure is disposed over the semiconductor substrate. The conductive via is disposed over and electrically coupled to the interconnect structure. The dielectric layer is disposed over the interconnect structure and laterally encapsulating the conductive via, wherein the dielectric layer includes a sidewall and a bottom surface facing the interconnect structure, and the sidewall of the dielectric layer is tilted with respect to the bottom surface of the dielectric layer. The encapsulant laterally encapsulates the device die. In some embodiments, the package further includes a passivation layer between the dielectric layer and the interconnect structure, and an upper surface of the passivation layer facing the dielectric layer is in contact with the encapsulant. In some embodiments, an angle between the sidewall of the dielectric layer and the bottom surface of the dielectric layer is in a range from about 40 degrees to about 140 degrees. In some embodiments, a lateral distance between the dielectric layer and a sidewall of the semiconductor substrate is in a range from about 2 microns to about 15 microns. In some embodiments, the package further includes conductive pads over the interconnect structure, and a bottom edge of the dielectric layer overlaps an outermost conductive pad. In some embodiments, the package further includes conductive pads over the interconnect structure, and a lateral distance between a bottom edge of the dielectric layer and a center of an outermost conductive pad is in a range from 0 micron to about 5 microns. In some embodiments, the package further includes semiconductor debris disposed between the interconnect structure and the encapsulant, and the dielectric layer is laterally distanced from the semiconductor debris.

In the present disclosure, a package including a device die and an encapsulant is provided. The device die includes a semiconductor substrate, an interconnect structure, a conductive via, and a dielectric layer. The interconnect structure is disposed over the semiconductor substrate. The conductive via is disposed over and electrically coupled to the interconnect structure. The dielectric layer is disposed over the interconnect structure and laterally encapsulating the conductive via. The encapsulant laterally encapsulates the device die. The encapsulant includes a first portion and a second portion of the encapsulant, the second portion of the encapsulant is between the first portion of the encapsulant and the dielectric layer and extends from the first portion of the encapsulant to the dielectric layer, and the second portion of the encapsulant overlaps the semiconductor substrate. In some embodiments, a thickness of the first portion of the encapsulant is greater than a thickness of the second portion of the encapsulant. In some embodiments, a top surface of the first portion of the encapsulant and a top surface of the second portion of the encapsulant are coplanar. In some embodiments, the package further includes a passivation layer between the dielectric layer and the interconnect structure, and an upper surface of the passivation layer facing the dielectric layer is in contact with the second portion of the encapsulant. In some embodiments, a first interface between the first portion of the encapsulant and the semiconductor substrate is laterally distanced from a second interface between the second portion of the encapsulant and the dielectric layer. In some embodiments, a second interface between the second portion of the encapsulant and the dielectric layer is smoother than a first interface between the first portion of the encapsulant and the semiconductor substrate. In some embodiments, the package further includes conductive pads over the interconnect structure, and the second portion of the encapsulant laterally overlaps an outermost conductive pad.

In the present disclosure, a method is provided. The method including: disposing a dielectric layer covering a conductive via of a wafer; removing a portion of the dielectric layer to form a first trench in the dielectric layer; performing a grooving process to form a second trench in the wafer, wherein the first trench is above the second trench, and a first width of the first trench is larger than a second width of the second trench; and performing a singulation process to separate the wafer into a plurality of device dies. In some embodiments, the first trench and the second trench extend along a scribe line of the wafer. In some embodiments, a first width of the first trench is larger than a width of the scribe line. In some embodiments, the first trench overlaps with the second trench. In some embodiments, a passivation layer under the dielectric layer is exposed after removing the portion of the dielectric layer. In some embodiments, removing the portion of the dielectric layer is performed through a patterning process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a device die comprising:
      a semiconductor substrate;
      an interconnect structure disposed over the semiconductor substrate;
      a conductive via disposed over and electrically coupled to the interconnect structure;
      a dielectric layer disposed over the interconnect structure and laterally encapsulating the conductive via;
      a passivation layer disposed between the dielectric layer and the interconnect structure; and
   an encapsulant laterally encapsulating the device die, wherein the dielectric layer is in contact with a first portion of an upper surface of the passivation layer, the encapsulant is in contact with a second portion of the upper surface of the passivation layer as well as a sidewall of the passivation layer.

2. The package of claim 1, wherein the dielectric layer comprises a sidewall and a bottom surface facing the interconnect structure, and the sidewall of the dielectric layer is in contact with the encapsulant, and the bottom surface of the dielectric layer covers and is in contact with the passivation layer.

3. The package of claim 2, wherein the sidewall of the dielectric layer is offset from the sidewall of the semiconductor substrate.

4. The package of claim 1, wherein a top surface of the dielectric layer substantially levels a top surface of the encapsulant and a top surface of the conductive via.

5. The package of claim 1 further comprising a redistribution dielectric layer and a redistribution line, wherein the redistribution dielectric layer and the redistribution line are disposed over the encapsulant, the dielectric layer and the conductive via, and the redistribution line is spaced apart from the dielectric layer by the redistribution dielectric layer.

6. The package of claim 1, wherein the conductive via is spaced apart from the encapsulant by the dielectric layer.

7. The package of claim 1 further comprising semiconductor debris disposed between the interconnect structure and the encapsulant, and the dielectric layer is laterally distanced from the semiconductor debris.

8. A package comprising:
   a device die comprising:
      a semiconductor substrate;
      an interconnect structure disposed over the semiconductor substrate;
      a conductive via disposed over and electrically coupled to the interconnect structure; and
      a dielectric layer disposed over the interconnect structure and laterally encapsulating the conductive via;
      a passivation layer disposed between the dielectric layer and the interconnect structure; and
   an encapsulant laterally encapsulating the device die; and
   wherein the encapsulant comprises a first portion and a second portion of the encapsulant, the second portion of the encapsulant is between the first portion of the encapsulant and the dielectric layer and extends from the first portion of the encapsulant to the dielectric layer, and an upper surface of the passivation layer is in contact with the second portion of the encapsulant.

9. The package of claim 8, wherein a thickness of the first portion of the encapsulant is greater than a thickness of the second portion of the encapsulant.

10. The package of claim 8, wherein a top surface of the first portion of the encapsulant and a top surface of the second portion of the encapsulant are coplanar.

11. The package of claim 8, wherein the second portion of the encapsulant overlaps the semiconductor substrate.

12. The package of claim 8, wherein a first interface between the first portion of the encapsulant and the semiconductor substrate is laterally distanced from a second interface between the second portion of the encapsulant and the dielectric layer.

13. The package of claim 8, wherein a second interface between the second portion of the encapsulant and the dielectric layer is smoother than a first interface between the first portion of the encapsulant and the semiconductor substrate.

14. The package of claim 8 further comprising conductive pads over the interconnect structure, and the second portion of the encapsulant overlaps an outermost conductive pad.

15. A package comprising:
a device die comprising:
- a semiconductor substrate;
- an interconnect structure disposed on the semiconductor substrate;
- a passivation layer disposed on the interconnect structure;
- conductive terminals disposed on the passivation layer and electrically connected to the interconnect structure;
- a dielectric layer disposed on the passivation layer and laterally encapsulating the conductive terminals, wherein a portion of an upper surface of the passivation layer is uncovered by the dielectric layer; and an encapsulant laterally encapsulating the device die, wherein the portion of the upper surface of the passivation layer uncovered by the dielectric layer is in contact with the encapsulant.

16. The package of claim 15, wherein a top surface of the dielectric layer substantially levels with top surfaces of the conductive terminals.

17. The package of claim 15, wherein a top surface of the encapsulant substantially levels with a top surface of the dielectric layer and top surfaces of the conductive terminals.

18. The package of claim 15, wherein the encapsulant covers sidewalls of the dielectric layer, the portion of an upper surface of the passivation layer uncovered by the dielectric layer, sidewalls of the interconnect structure, and sidewalls of the semiconductor substrate.

19. The package of claim 15, wherein the encapsulant is in contact with sidewalls of the passivation layer as well as the portion of the upper surface of the passivation layer uncovered by the dielectric layer.

20. The package of claim 15, wherein the encapsulant comprises a first portion and a second portion of the encapsulant, the second portion of the encapsulant is between the first portion of the encapsulant and the dielectric layer and extends from the first portion of the encapsulant to the dielectric layer, and the portion of the upper surface of the passivation layer uncovered by the dielectric layer is in contact with the second portion of the encapsulant.

* * * * *